United States Patent [19]

Butrie et al.

[11] Patent Number: 5,841,178
[45] Date of Patent: *Nov. 24, 1998

[54] OPTICAL COMPONENT PACKAGE

[75] Inventors: Timothy Butrie, Orefield; Mindaugas Fernand Dautartas, Alburtis; Shaun P. Scrak, Souderton, all of Pa.

[73] Assignee: Lucent Technologies Inc., Murray Hill, N.J.

[*] Notice: This patent issued on a continued prosecution application filed under 37 CFR 1.53(d), and is subject to the twenty year patent term provisions of 35 U.S.C. 154(a)(2).

[21] Appl. No.: 720,888

[22] Filed: Oct. 4, 1996

[51] Int. Cl.$^6$ .............................................. H01L 31/0203
[52] U.S. Cl. ........................... 257/433; 257/99; 257/458; 257/680; 257/779; 361/806; 361/820
[58] Field of Search ............................... 257/433, 99, 680, 257/779, 434, 458; 361/806, 820

[56] References Cited

U.S. PATENT DOCUMENTS

| 5,011,256 | 4/1991 | Johnson et al. | 257/433 |
| 5,132,532 | 7/1992 | Watanabe | 257/433 |
| 5,239,198 | 8/1993 | Lin et al. | 257/693 |
| 5,424,573 | 6/1995 | Kato et al. | 257/433 |

*Primary Examiner*—David Ostrowski

[57] ABSTRACT

Disclosed is an optical package which is economical to manufacture. An optical component, such as a PIN photodiode, is bonded to a substrate such as silicon with no metallization on its side surfaces. The resulting assembly is solder bonded to the bottom surface of the package so that a side surface of the substrate is adjacent to the bottom surface with essentially no solder therebetween.

7 Claims, 2 Drawing Sheets

OPTICAL COMPONENT PACKAGE

TECHNICAL FIELD

This invention relates to lightwave communications, and in particular, to an economical optical components package.

BACKGROUND OF THE INVENTION

In lightwave communications systems, materials and the necessary procedures for aligning components constitute a major part of the cost of component packages. For example, receiver packages typically employ a PIN photodiode bonded to a ceramic substrate which includes metallization extending from the top of the substrate to the side walls of the substrate. The PIN diode is electrically coupled to the metallization by a wire bond. The requirement for a wrap-around metallization and a wire bond increases the packaging costs. Further, the ceramic submount must be aligned with the incoming light in a fairly tedious process.

It is desirable to reduce the cost of the optical components package by providing a submount which is easy to fabricate and to align with the other components in the system.

SUMMARY OF THE INVENTION

The invention is an optical package including an optical component assembly comprising a substrate and an optical component bonded to a major surface of the substrate. The substrate includes at least one side adjacent to the major surface which is free of metalization contacting the component. The side is solder bonded to a bottom surface of the package with essentially no solder between the side and the bottom surface.

BRIEF DESCRIPTION OF THE DRAWINGS

These and other features of the invention are delineated in detail in the following description. In the drawing.

It will be appreciated that, for purposes of illustration, these figures are not necessarily drawn to scale.

DETAILED DESCRIPTION

Figure 1:
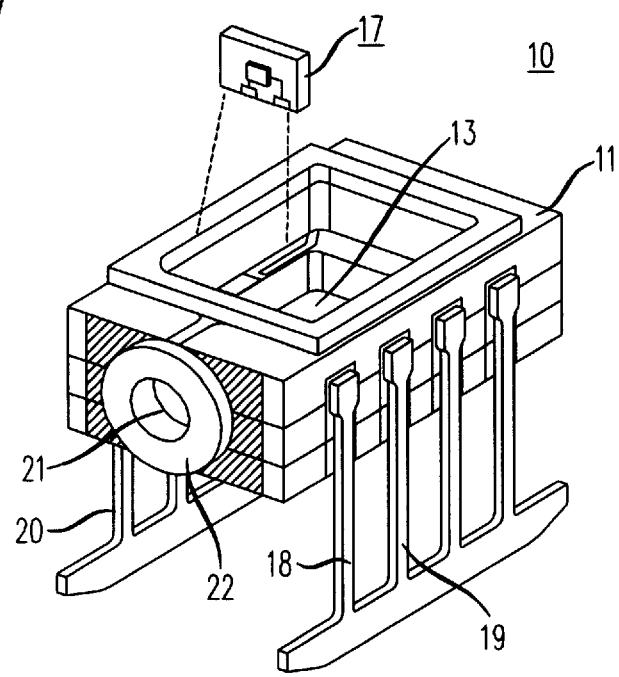
FIG. 1 is a perspective view of a package in accordance with an embodiment of the invention.
Figure 2:
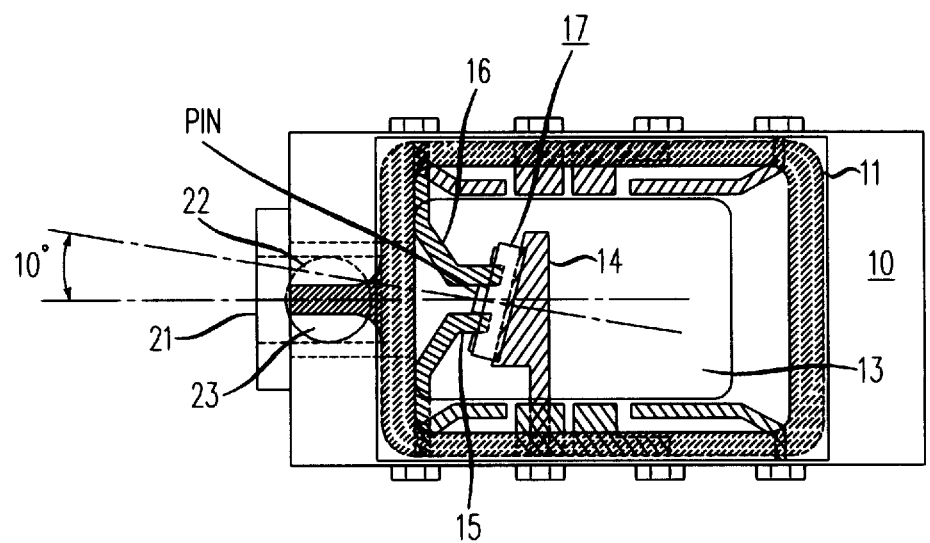
FIG. 2 is a top view of the package of FIG. 1.

Referring now to the drawings, in which like reference numerals identify similar or identical elements, FIGS. 1 and 2 illustrate an optical component package, 10, in accordance with one embodiment of the invention. The package, 10, includes a package housing, 11, which is typically made of ceramic. The housing, 11, includes a cavity, 12, formed therein to house the various components. The bottom surface, 13, of the cavity includes metal contact layers, 14–16, for providing electrical contact to portions of a receiver component, 17, to be described. The contact layers, 14–16, can be formed by standard techniques well-known in the art. The contact layers, 14–16, extend to respective contact pins, e.g., 18–20, which are formed on the sides of the package for providing external electrical contact to the receiver component, 17.

The front of the package, 10, includes an aperture, with a sleeve, 22, mounted therein. The sleeve, 22, includes a lens, 23, for focusing incoming light onto the receiver component, 17. It will be appreciated that various other components, such as pre-amplifier may also be included within the package.

Figure 3:
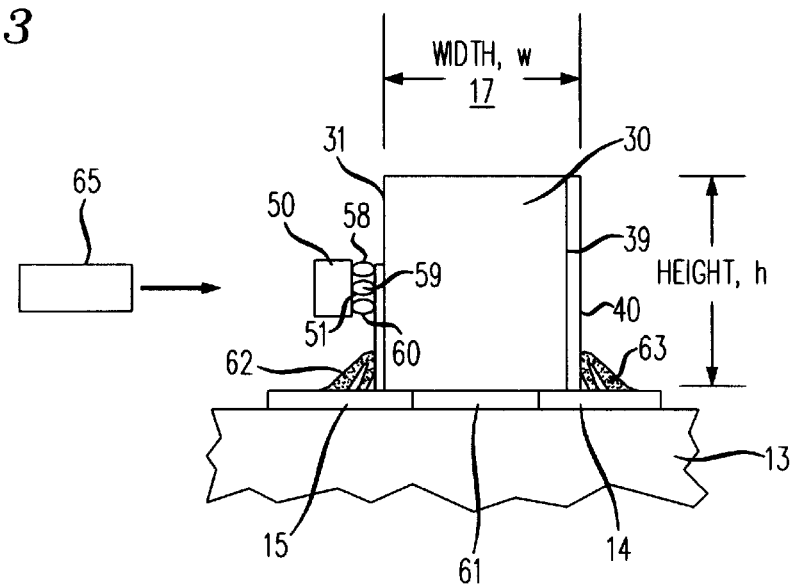
FIG. 3 is a side view of a portion of the package of FIGS. 1 and 2.
Figure 4:
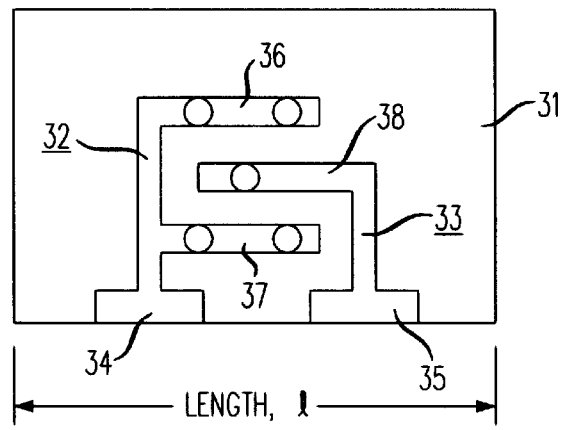
FIG. 4 is a plan view of a portion of the package illustrated in FIG. 3.
Figure 5:
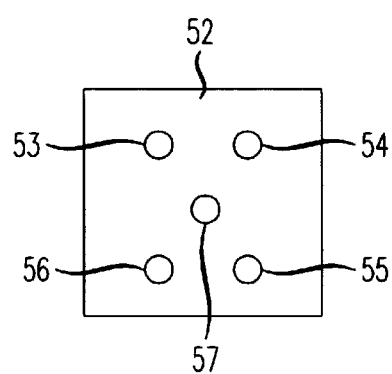
FIG. 5 is a plan view of one surface of another portion of the portion of the package illustrated in FIG. 3.

Focussing now primarily on the receiver component assembly, 17, reference is made to FIGS. 3–6. The receiver component assembly includes a semiconductor substrate, 30, which is preferably silicon. The silicon substrate can be formed to precise dimensions by known techniques. Of particular interest in this application is the length, l, of the substrate which is typically in the range 3 to 5 mm (metric). The width, w, of the substrate is typically in the range 1 to 3 mm (metric) and the height, h, is typically in the range 1 to 3 mm (metric). Formed on the front surface, 31, of the substrate, 30, as illustrated in FIG. 4, are layers of metal, 32 and 33, such as Ti/Pt/Au, deposited and patterned by well known photolithographic techniques. Layer 32 is patterned into two metal fingers, 36 and 37, and a bonding pad, 34, at one edge (the bottom in the view of FIG. 4) of the substrate, 30. Layer 33 is patterned into a single metal finger, 38, which is positioned between the fingers 36 and 37, and a bonding pad, 35, at the substrate edge. Formed on essentially the entire back surface, 39, of the substrate, 30, is a layer of metal, 40, such as Ti/Pt/Au.

Mounted on the front surface, 31, of the substrate, 30, is a standard PIN photodiode component, 50, which is capable of receiving incoming light and converting it to an electrical signal. As known in the art, the typical diode is fabricated from a silicon chip with a p-type dopant region in the middle surrounded by an intrinsic silicon region which is, in turn, surrounded by a region of n-type dopant. The back surface, 51 of the chip is covered by a dielectric layer, 52 of FIG. 5, which includes apertures, 53–56 around the perimeter and an aperture, 57, in the center. The apertures 53–56 expose portions of the n-type dopant region and the aperture 57 exposes a portion of the p-type dopant region.

In order to bond the photodiode component, 50, to the substrate, 30, contact metallization (not shown, which is typically a multilayer of Be, Au, Cr, Pt, and Au, is deposited into the apertures 53–57. After alloying the metallization, solder, such as Au, Sn, may be predeposited onto the resulting contacts using standard processes. The component 50 is then positioned so that the solder makes physical and electrical contact with the metal layers, 32 and 33 on the substrate, 30. The circles in FIG. 4 illustrate the positions of the predeposited solder. Alternatively, the solder could be deposited on the metal layers in the positions shown and the chip, 50, placed thereover. It will be noted that the p-type region will contact the finger, 38, of the metal layer, while the n-type region will contact the fingers, 36 and 38, of the layer 32 through their respective solder formations. Once the chip is in position, the structure is heated to reflow the solder and thereby provide an essentially permanent bond between the chip, 50, and substrate, 30. In the integrated circuit field, this type of bonding is often referred to as "flip chip bonding."

In an alternative embodiment, layers 32 and 33 can be a non-wetting layer (e.g., Al) with wettable metal (Ti/Pt/Au) deposited where PIN contacts and pads (34/35) should be to allow self alignment of the component. Once the component, 50, and substrate, 30, are properly bonded, the resulting component assembly, 17, may be mounted within the package, 10. This is accomplished by orienting the substrate, 30, vertically as shown in FIG. 3, so that one of its side surfaces, 61, faces the bottom, 13, of the cavity, 12, and the bonding pads, 34 and 35, of the metal layers, 32 and 33, respectively, make electrical contact with their corresponding contact layers, 16 and 15, on the bottom of the cavity. Desirably, the metal layer, 40, also makes electrical contact with the contact layer, 14, on the bottom surface. In the example shown, the contact layers, 14–16 extend underneath the side surface, 61. It may also be possible to space the contact layers so that the side surface is made flush with the bottom, 13, of the cavity while the contact layers, 14–16 make physical contact with their respective pads or are positioned in sufficiently close proximity thereto so that electrical contact is made after the soldering step to be described.

In order to bond the component assembly, 17, to the bottom surface, solder performs, 62 and 63 being visible in FIG. 3, are placed or positioned on the contact layers, 14–16, after the positioning of the component assembly, 17, on the contact layers. The solder employed was Pb/Sn (Lead/Tin). Alternatively, the solder could be deposited prior to positioning the component as long as the area which will be covered by the surface 61 is kept essentially free of the solder. The solder is heated, typically to a temperature in the range 190 to 220 deg C. for a period in the range 0.25 to 1 min in order to reflow the solder and form a strong bond between the contact layers, 14–16, and the corresponding metal layers, 40, 33 and 32, on the substrate, 30.

Surprisingly, a bond is formed which is sufficient to withstand a force of at least 500 grams so that the component assembly is secured to the cavity bottom, 13, without the need for any metal or solder on the surface, 61, of the substrate which is adjacent to the bottom surface, 13. The formation of such a bond without solder underneath the component has several advantages. Since applicants have discovered that a metal layer is not needed on the side surfaces (e.g., surface 61) of the substrate to obtain a strong bond, the deposition of metal after dicing of the substrate is not needed and a processing step is thereby eliminated. Further, since the dimension, h, of the substrate is easily controlled and the thickness of the contact layers, 14–16, is small (typically less than 0.010 mm) and easily controlled, vertical alignment of the component assembly, 17, for receipt of light from fiber, 65, (which is attached to the sleeve 22 in the package) is not necessary in assembling the package, 10. Thus, further economies are realized in fabricating the package.

Various modifications of the invention will become apparent to those skilled in the art. For example, although the invention has been described in terms of a receiver component, the principles can be applied to other components such as light emitting diodes and surface emitting lasers. Further, the substrate, 30, need not be silicon, but can be materials such as ceramic or plastic. All such variations which basically rely on the teachings through which the invention has advanced the art are properly considered within the scope of the invention.

The invention claimed is:

1. An optical package comprising a floor with integral sidewalls for housing an optical assembly, said package including an optical component assembly comprising:

a substrate including a first major surface and a second major surface, with at least one side surface therebetween, the first major surface including electrical connection leads and associated bond pad sites; and an optical component bonded to the electrical connection leads on the first major surface; and the package floor including electrical contact regions, the substrate attached to said package floor in a manner such that the one side surface is adjacent to said package floor and the substrate bond pad sites are solder bonded to the package floor electrical contact regions.

2. A package according to claim 1 wherein the optical component is bonded to the substrate by solder bumps.

3. A package according to claim 1 wherein the substrate comprises silicon.

4. A package according to claim 1 further comprising metallization formed on the second major surface of the substrate, which is also in physical contact with and solder bonded to an electrical contact region on the floor of the optical package.

5. A package according to claim 1 wherein the solder bond is capable of withstanding a force of at least 500 grams.

6. A package according to claim 1 wherein the component is a PIN photodiode.

7. A package according to claim 6 wherein the major surface includes first metallization for electrically contacting the photodiode, the metallization comprising interdigitated metal fingers which terminate in bonding pads for attachment to second metallization on the bottom surface of the package.

* * * * *